(12) United States Patent
Ljungbro et al.

(10) Patent No.: US 12,501,584 B2
(45) Date of Patent: Dec. 16, 2025

(54) ELECTRONIC COMPONENT ASSEMBLY, AN ANTENNA ARRAY SYSTEM, AND ELECTRONIC DEVICE, AND A METHOD FOR MANUFACTURING AN ELECTRICAL COMPONENT ASSEMBLY

(71) Applicant: Telefonaktiebolaget LM Ericsson (publ), Stockholm (SE)

(72) Inventors: Agneta Ljungbro, Bjärred (SE); Emil Nylander, Lund (SE); Per Ingelhag, Alingsås (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 78 days.

(21) Appl. No.: 18/696,174

(22) PCT Filed: Oct. 1, 2021

(86) PCT No.: PCT/EP2021/077045
§ 371 (c)(1),
(2) Date: Mar. 27, 2024

(87) PCT Pub. No.: WO2023/051930
PCT Pub. Date: Apr. 6, 2023

(65) Prior Publication Data
US 2024/0407136 A1   Dec. 5, 2024

(51) Int. Cl.
*H01Q 1/02*   (2006.01)
*H05K 7/20*   (2006.01)

(52) U.S. Cl.
CPC ............. *H05K 7/2039* (2013.01); *H01Q 1/02* (2013.01)

(58) Field of Classification Search
CPC ............ H01Q 1/02; H01Q 1/48; H01Q 1/523; H01Q 1/2283; H01Q 21/061;
(Continued)

(56) References Cited

U.S. PATENT DOCUMENTS 3,351,953 A   11/1967   Sear
8,617,927 B1   12/2013   Margomenos et al.
(Continued)

FOREIGN PATENT DOCUMENTS

WO   2018132603 A1   7/2018

*Primary Examiner* — Tung X Le
(74) *Attorney, Agent, or Firm* — Murphy, Bilak & Homiller, PLLC

(57) ABSTRACT

An electrical component assembly (301) comprising a heat sink (310), electrical components (321-1, 321-2, 322, 323) arranged on the heat sink (310) and an interconnect (330*a*) electrically connecting the electrical components (321-1, 321-2, 322, 323). The heat sink (310) is integrated with the electrical interconnect (330*a*) such that the electrical interconnect (330*a*) is at least partly arranged in and extends along a cavity (311*a*, 311*b*) of the heat sink (310). The electrical interconnect (330*a*) comprises at least one layer (332, 334) of deposited material comprising electrically conductive material forming one or more interconnecting conductors (338, 339). The interconnect further comprises one or more dielectric layers (331, 333, 335) of deposited material which isolate the one or more interconnecting conductors (338, 339). The one or more interconnecting conductors (338, 339) electrically contacts the respective electrical component in a respective contact area (311-*c*) of the cavity (311*a*, 311*b*). The electrical components (321-1, 321-2, 322, 323) are arranged on the heat sink (310) such that a respective one of one or more electrical contacts (321-*c*1) of the electrical components align with a respective interconnecting conductor (351).

17 Claims, 13 Drawing Sheets

(58) Field of Classification Search
CPC .. H01Q 21/065; H01Q 21/0087; H05K 1/021; H05K 1/0243; H05K 1/0221; H05K 3/0061; H05K 7/2039; H05K 2201/10098; H05K 2201/09809; H05K 2201/09745

See application file for complete search history.

(56) References Cited

U.S. PATENT DOCUMENTS

| | | | |
|---|---|---|---|
| 9,385,083 B1 | 7/2016 | Herrault et al. | |
| 11,075,453 B1* | 7/2021 | Bulumulla | H01Q 1/422 |
| 11,081,804 B2* | 8/2021 | Mizunuma | H01Q 3/26 |
| 11,531,084 B1* | 12/2022 | James | H01Q 21/0087 |
| 11,784,417 B2* | 10/2023 | Chang | H01Q 9/0457 |
| | | | 343/702 |
| 2006/0097385 A1 | 5/2006 | Negley | |
| 2021/0219428 A1 | 7/2021 | Ingelhag et al. | |

* cited by examiner

ELECTRONIC COMPONENT ASSEMBLY, AN ANTENNA ARRAY SYSTEM, AND ELECTRONIC DEVICE, AND A METHOD FOR MANUFACTURING AN ELECTRICAL COMPONENT ASSEMBLY

TECHNICAL FIELD

The embodiments herein relate to an electrical component assembly, an antenna array system, an electronic device, and methods for manufacturing an electrical component assembly. A corresponding computer program and a computer program carrier are also disclosed.

BACKGROUND

For high-bandwidth radios (e.g. radio receiver and/or radio transmitter) used in 5G and 6G communications, a radio frontend of the radio needs to be integrated closely with one or more antennas of the radio. Today the radio often comprises one or several antenna array systems which may comprise multiple antennas and radio circuits. Interconnect speed between Radio-Frequency Integrated Circuits (RFIC) and Digital Beam Forming (DBF) and/or Analog Beam Forming (ABF) circuits is increasing and this leads to difficult routing problems on Printed Circuit Boards (PCB) used for mounting and interconnecting the radio components, such as antennas, RFICs, ABF and DBF circuits. Using cables and connectors in combination with a good cooling to a heat sink is difficult.

Specifically, radio network equipment such as base stations, access points and remote-radio heads comprise such high-bandwidth radios. The power generated in a typical radio product may be in the range of 100 W-1000 W and the heat dissipation in the radio is thus considerable.

As mentioned above, routing of electrical signals and/or power in an antenna PCB is today very difficult and the PCB used may be an advanced μvia PCB with many layers.

FIG. 1 illustrates an example of a prior art antenna array system 100. A multilevel PCB 101, comprising multiple copper layers for routing of electrical signals, is mounted on a heatsink 110. An antenna array 140, that is an array of antennas, is mounted on or is an integrated part of an antenna PCB 150 which is mounted onto the multilevel PCB 101. RFIC packages 121-1, each comprising an RFIC die 122 are mounted on the antenna PCB 150. Each RFIC die 122 has an exposed backside such that it may contact the heatsink 110 directly via a Cu-coin 130.

The number of PCB layers is on the limit for what can be produced, and the PCB boards are very costly. For example, a PCB with coins as in FIG. 1 is expensive.

Further, since the area under the antenna array is scaling with the inverse of the frequency, the area available for packages of electronic components and routing out from the packages will be even smaller for higher frequencies (e.g. in 6G 100 GHz). Connecting cables and flex-film directly on top of a package is one possibility but in the case of many connections this may lead to a difficult assembly problem. A further problem with cables is that coaxial cables are expensive and difficult to manufacture with small geometries.

SUMMARY

An object of embodiments herein may be to obviate some of the problems mentioned above related to mounting and interconnecting electrical components, e.g. radio components, such as antenna arrays, RFIC, ABF and DBF circuits, and the heat removal from these components.

According to a first aspect, the object is achieved by an electrical component assembly comprising a heat sink, electrical components arranged on the heat sink and an electrical interconnect electrically connecting the electrical components with each other.

The heat sink is integrated with the electrical interconnect such that the electrical interconnect is at least partly arranged in and extends along a cavity of the heat sink extending between the electrical components. The electrical interconnect comprises at least one layer of deposited material comprising electrically conductive material forming one or more interconnecting conductors. The interconnect further comprises one or more dielectric layers of deposited material which isolate the one or more interconnecting conductors. The one or more interconnecting conductors electrically contacts the respective electrical component in a respective contact area of the cavity. The electrical components are arranged on the heat sink such that a respective one of one or more electrical contacts of the electrical components aligns with a respective interconnecting conductor of the interconnect.

According to a second aspect, the object is achieved by an antenna array system comprising the electrical component assembly according to the first aspect. The antenna array system comprises an antenna array.

The electrical components of the electrical component assembly comprise at least two RF circuits. The electrical interconnect comprises a first interconnect integrated in a first cavity of the heat sink between the at least two RF circuits.

According to a third aspect, the object is achieved by an electronic device comprising the electrical component assembly according to the first aspect.

According to a fourth aspect, the object is achieved by a method for manufacturing an electrical component assembly according to the first aspect. The method comprises:

providing the heat sink with the cavity;

providing, by additive manufacturing, the one or more dielectric layers and the at least one layer comprising electrically conductive material of the electrical interconnect to the cavity of the heat sink, such that the interconnect is at least partly arranged in and extends along the cavity of the heat sink; and arranging the electrical components on the heat sink such that the respective electrical contact of the electrical components aligns with the respective interconnecting conductor of the interconnect.

According to a further aspect, the object is achieved by a computer program comprising instructions, which when executed by a computer-aided manufacturing module causes the computer-aided manufacturing module to perform actions according to the fourth aspect above.

According to a further aspect, the object is achieved by a carrier comprising the computer program of the further aspect above, wherein the carrier is one of an electronic signal, an optical signal, an electromagnetic signal, a magnetic signal, an electric signal, a radio signal, a microwave signal, or a computer-readable storage medium.

Since the electrical interconnect is at least partly arranged in and extends along the cavity of the heat sink cost of manufacturing the electrical component assembly is reduced since there is no need for cables or PCB for connection between the electrical components. Further, an interconnect which requires a small area of the electrical component to be dedicated to the interconnect is provided. That is, due to the arrangement of the interconnect in the heat sink only a small area of the electrical component needs to be dedicated to the interconnect.

A further advantage of embodiments herein is that the electrical components may be soldered directly to the heat sink without using a PCB which provides for a good thermal connection to the heat sink and thus a good heat removal from the electrical components.

BRIEF DESCRIPTION OF THE DRAWINGS

In the figures, features that appear in some embodiments are indicated by dashed lines.

The various aspects of embodiments disclosed herein, including particular features and advantages thereof, will be readily understood from the following detailed description and the accompanying drawings, in which.

DETAILED DESCRIPTION

As mentioned above, an object of embodiments herein is to provide an electrical component assembly including a heat sink, or in other words a heat-sink assembly, which has a low manufacturing cost, small footprint and a high heat removal. Thus, embodiments herein relate to an electrical component assembly including a heat sink.

Embodiments herein provide for integration of multiple layers of dielectric and conducting material, such as metal, into cavities in the heat sink to form an interconnect between two electronic components.

Embodiments herein provide the possibility to solder the electrical component directly to the heat sink without using a PCB.

For example, by integrating multiple layers of dielectric and metal into cavities in the heat sink there is no need for cables or PCB for connection between the electrical components or between packages of the electrical components.

Such a solution enables to have both a good thermal connection to the heat sink and a good interconnect with a low manufacturing cost. A good interconnect may for example be characterized by a low resistance.

As an example, the heatsink may be used as a substrate and/or a PCB for electrical components and dielectric and conductive materials may be deposited on the heatsink using Additive Manufacturing (AM) into cavities in the heatsink. These distributed interconnect areas may then be used for connecting electrical components from a first (top) side of a package of the components and connecting the backside of a component die to the heatsink with a Thermal interface material (TIM) or solder. In case of an Antenna in Package solution this can be the only soldering level. Larger antenna arrays or an additional antenna package may be soldered on top of RFIC packages.

Figure 1:
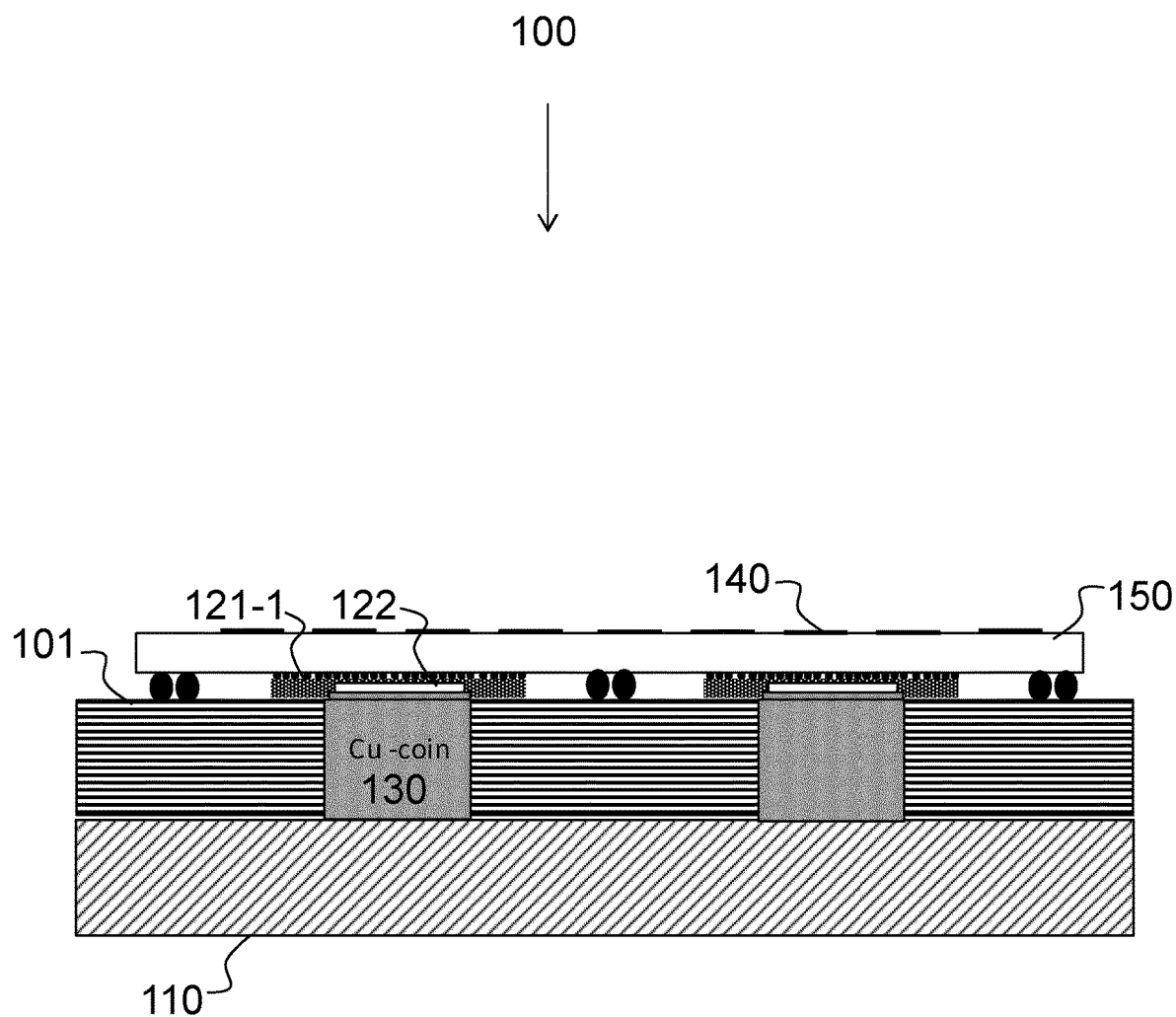
FIG. 1 illustrates an exemplifying embodiment of a prior art multilevel PCB comprising RFIC and antennas.
Figure 2A:
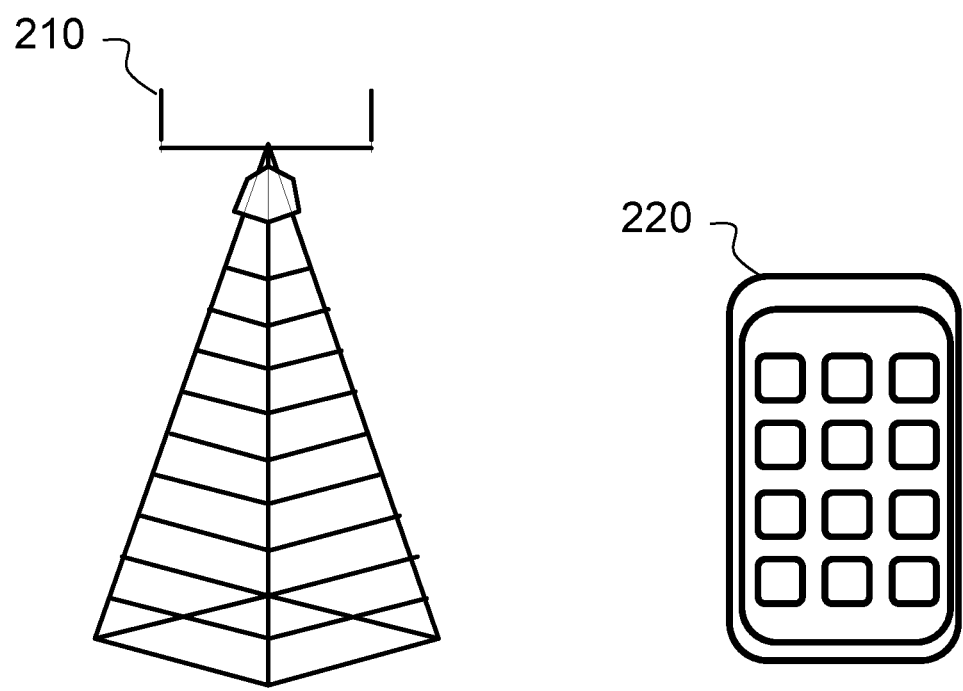
FIG. 2a illustrates exemplifying embodiments of electronic devices.

Embodiments herein may be advantageously used in electronic equipment, in particular electronic radio network equipment. Such electronic equipment will also be referred to as electronic devices herein. FIG. 2a illustrates electronic devices in the form of a base station 210 and a mobile phone 220.

Figure 2B:
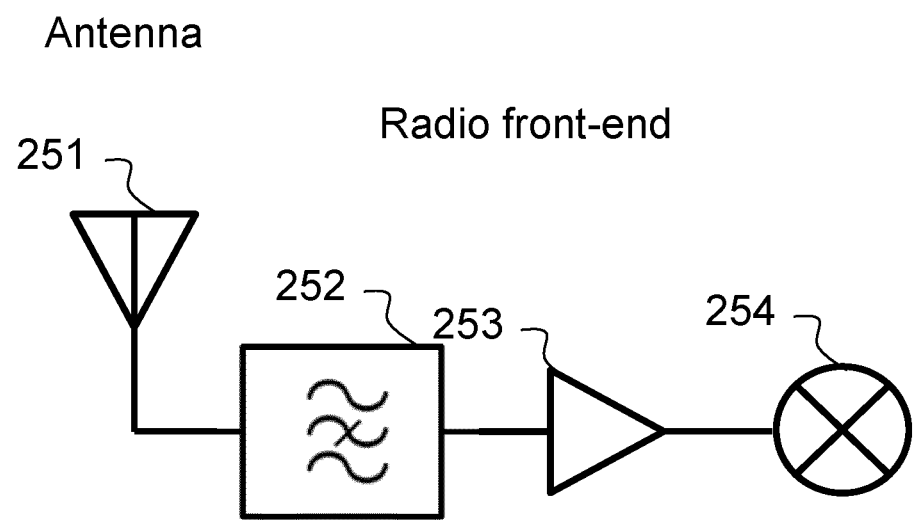
FIG. 2b illustrates exemplifying embodiments of a radio receiver.

FIG. 2b schematically illustrates a part of a radio equipment, such as the base station 210, related to transmission and reception of radio signals. The radio equipment is illustrated with electrical symbols. In FIG. 2b the radio equipment comprises an antenna 251 and a radio front-end comprising a bandpass filter 252, an RF amplifier 253 and a mixer 254. Embodiments herein are specifically directed to assembly of such electrical components on a heat sink, for example for providing routing of signals, heat removal and power to the components.

Figure 3A:
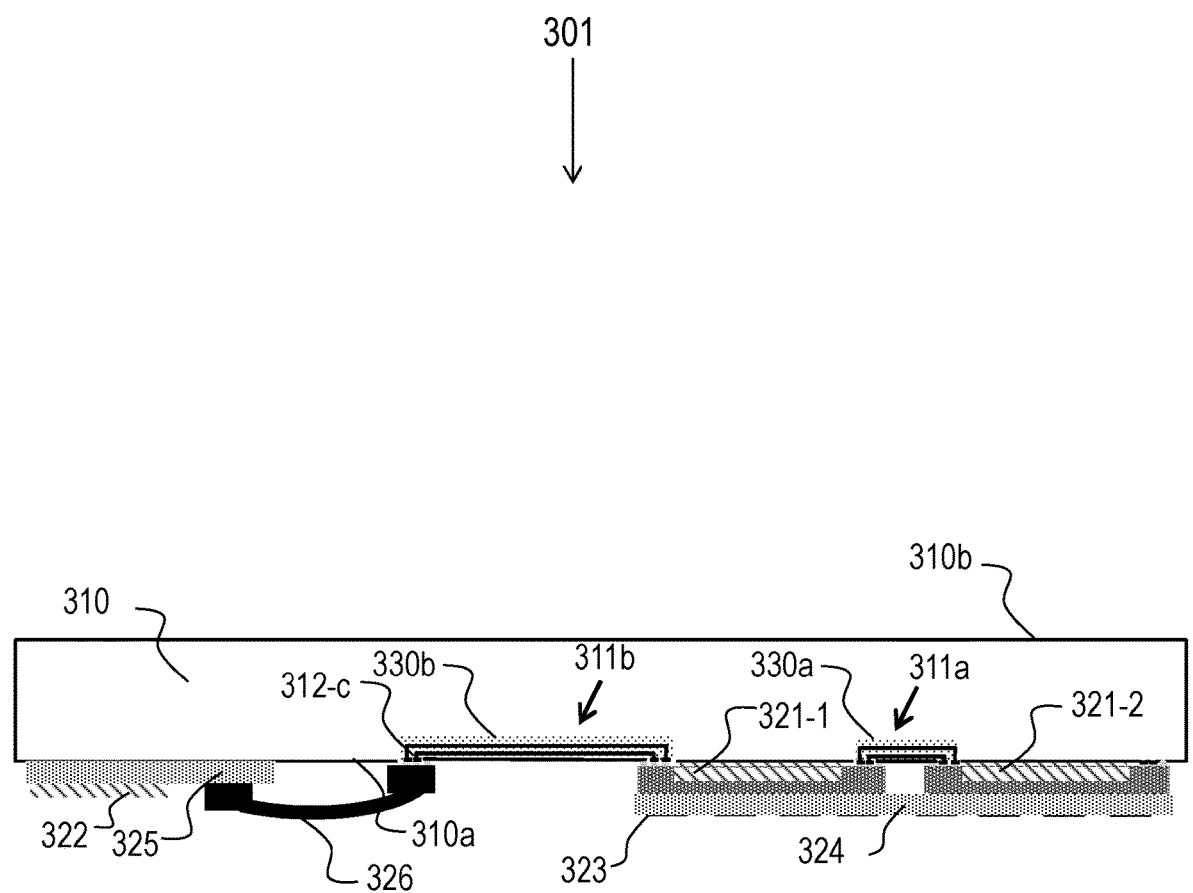
FIG. 3a illustrates exemplifying embodiments of an antenna array system.

Embodiments herein will now be described with reference to FIG. 3a. FIG. 3a schematically depicts an electronic component assembly 301 comprising a heat sink 310. The electrical component assembly may also be referred to as a heat sink assembly. FIG. 3a shows a cross section of the heatsink 310 with components assembled onto the heatsink 310.

The electronic component assembly 302 further comprises electrical components arranged on the heat sink 310. For example, the electrical components may comprise a first electrical component 321-1, a second electrical component 321-2, 322 and a third electrical component 323. The electrical components may comprise antennas and radio front-ends or one or more parts of a radio front-end, such as the components illustrated in FIG. 2b: the bandpass filter 252, the RF amplifier 253 and the mixer 254. The electrical components may of course comprise other filters than the bandpass filter 252 illustrated in FIG. 2b.

More specifically, the electrical components 321-1, 321-2, 322, 323 may be arranged on one or more surfaces 310a, 310b of the heat sink 310. A respective surface 310a, 310b of the heat sink 310 may be a flat surface, such that it may be referred to as a face. In some embodiments herein all, or at least two, of the electrical components 321-1, 321-2, 322, 323 are arranged on a first surface 310a, while in other embodiments herein the electrical components 321-1, 321-2, 322, 323 are arranged on the first surface 310a and on a second surface 310b. For example, the first electrical component 321-1 may be arranged on the first surface 310a, while the second electrical component 321-2, 322 may be arranged on the second surface 310b.

In FIG. 3a the electronic component assembly 301 is illustrated as an antenna array system, but other electronic components assembled onto a heatsink may also benefit from embodiments herein.

The electrical component assembly 301, and more particularly the antenna array system, may be comprised in an electronic device 210, 220. In some embodiments herein the electronic device is any of the base station 220, illustrated in FIG. 2a, an access point, a remote radio unit and the mobile phone 220, also illustrated in FIG. 2a. A remote radio unit may also be referred to as a remote radio-head. In general the electronic device may be any electronic device, and in particular any electronic device comprising radio communication, e.g. a smart watch.

In some embodiments herein at least one electrical component is any of: an Integrated Circuit, IC, a Phased Array Antenna Module, PAAM, a Printed Circuit Board, PCB, and a packaged component, such as Antenna in Package, AiP. The PAAM may be a mm-wave PAAM. The IC may be a silicon IC. But other materials, such as III-V or II-VI semiconductor materials or organic materials, may also be used for the IC.

The IC may comprise any one or more of a Radio-Frequency, RF, circuit, a Digital BeamForming circuit, an Analog BeamForming circuit, and an antenna. The RF circuit may be a radio front-end or comprise one or more parts of a radio front-end, such as the bandpass filter 252, the RF amplifier 253 and the mixer 254.

The first electrical component 321-1 may be exemplified as a first RF circuit 321-1. The second electrical component 321-2, 322 may be exemplified as a second RF circuit 321-2 and/or as a DBF circuit 322. The third electrical component 323 is illustrated as an antenna array 323 comprising a PCB 324 with an array of antennas mounted on the PCB. The antenna array comprises multiple antennas which are illustrated in FIG. 3a as thin plates elongated in the horizontal direction.

The heat sink 310 may be made of a material having good thermal properties such as a high thermal conductivity allowing for good heat dissipation between the electrical components 321-323 and the heat sink 310. The material of the heat sink 310 may further be electrically conducting. Typical materials for the heat sink 310 are Aluminum and Copper. Dielectric materials, such as BN, AlN, SiC may also be used for the heat sink 310.

The electronic component assembly 301 further comprises an electrical interconnect 330a, 330b electrically connecting the electrical components 321-1, 321-2, 322, 323 with each other.

The heat sink 310 is integrated with the electrical interconnect 330a, 330b such that the electrical interconnect 330a, 330b is at least partly arranged in and extends along a cavity 311a, 311b of the heat sink 310 extending between the electrical components 321-1, 321-2, 322, 323.

Figure 3B:
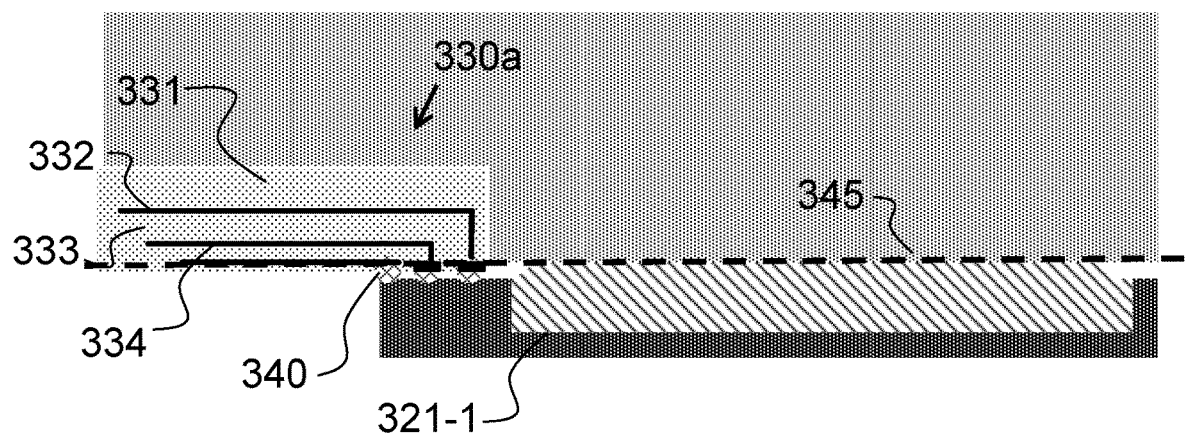
FIG. 3b illustrates exemplifying embodiments of an electrical component assembly.

FIG. 3b shows a zoom-in of the electrical interconnect 330a. The electrical interconnect 330a comprises at least one layer 332, 334 of deposited material comprising electrically conductive material forming one or more interconnecting conductors 338, 339 shown in FIG. 3c. The one or more interconnecting conductors 338, 339 may comprise a first interconnecting conductor 338 and a second interconnecting conductor 339. The first interconnecting conductor 338 may for example be configured for carrying a signal. The second interconnecting conductor 339 may for example be configured as ground, such as chassis ground, signal ground, or earth ground. There may be more interconnecting conductors for the signal or for further signals and for the ground.

The interconnect 330a further comprises one or more dielectric layers 331, 333 of deposited material which isolate the one or more interconnecting conductors 338, 339, for example by embedding the conductor 338, 339. The one or more interconnecting conductors 338, 339 electrically contacts the respective electrical component 321-1, 321-2, 322, 323 in a respective contact area 311-c of the cavity 311a, 311b. The electrical components 321-1, 321-2, 322, 323 are arranged on the heat sink 310 such that a respective one of one or more electrical contacts 321-1-c1, 321-2-c1, 321-2-c1, 321-2-c2 of the electrical components 321-323 align with a respective interconnecting conductor 338, 339 of the interconnect 330a. That is, the one or more electrical contacts 321-1-c1, 321-2-c1, 321-2-c1, 321-2-c2 of the electrical components 321-323 align with the respective interconnecting conductor 338, 339 of the interconnect 330a in the respective contact area 311-c of the cavity 311a, 311b. The contact area 311-c may be an area at the end of the cavity 311a, 311b. In the contact area 311-c the one or more interconnecting conductors 338, 339 may be arranged orthogonally against a surface of the heat sink 310 such that contact between the one or more interconnecting conductors 338, 339 and the one or more electrical contacts 321-1-c1, 321-2-c1 of the electrical components 321-323 may be made at the surface of the heat sink 310.

For example, in some embodiments the first electrical component 321-1 out of the electrical components 321-1, 321-2, 322, 323 is arranged on the first surface 310a of the heat sink 310 and at least a first end 340 of the electrical interconnect 330a electrically contacts the first electrical component 321-1 at a plane of the first surface 310a. In FIG. 3b the plane of the first surface 310a of the heat sink 310 is illustrated with a dashed horizontal line 345 along the lower surface of the heat sink 310.

When an antenna array system comprises the electrical component assembly 301, as illustrated in FIG. 3a, the electrical components of the electrical component assembly 301 may comprise at least two RF circuits 321-1, 321-2. That is, the first electrical component 321-1 may be exemplified with the first RF circuit, while the second electrical component 321-2 may be exemplified with the second RF circuit. The electrical interconnect 330a, 330b may then comprise a first interconnect 330a integrated in a first cavity 311a of the heat sink 310 between the at least two RF circuits 321-1, 321-2. The antenna array system comprising the electrical component assembly 301 may further comprise an antenna array 323. FIG. 3a illustrates a large number of antennas included in the antenna array 323. The number of antennas in an antenna array may sometimes be over a thousand.

The antenna array system may sometimes also be referred to as an antenna-integrated transceiver module, or an RF front-end system or an antenna-integrated front-end system.

The antenna array system may be for mm-wave radio communication (5G, 6G).

In some embodiments, when the antenna array system comprises the electronic component assembly 301, the electrical components 321-323 of the electrical component assembly 301 may further comprise the DBF circuit 322. The electrical interconnect 330a, 330b may then further comprise a second interconnect 330b integrated in a second cavity 311b of the heat sink 310 between one of the at least two RF circuits 321-1, 321-2 and the DBF circuit 322.

FIG. 3a illustrates the electronic component assembly 301 in the form of the antenna array system with a backside of packaged RFICs 321-1, 321-2 directly connected to the heat sink 310 and wherein the packaged RFICs 321-1, 321-2 are electrically connected to the integrated interconnect 330a, 330b. A PCB 325 of the DBF circuit 322 is connected with a cable 326 to another contact area 312-c of the second cavity 311b. However, the PCB 325 may also be connected with solder pads on the PCB 325 assembled onto the integrated interconnect 330b.

The electrical components 321-323 of the electrical component assembly 301 may further comprise other electrical components, such as a mixed signal circuit and/or a power circuit.

Figure 3C:
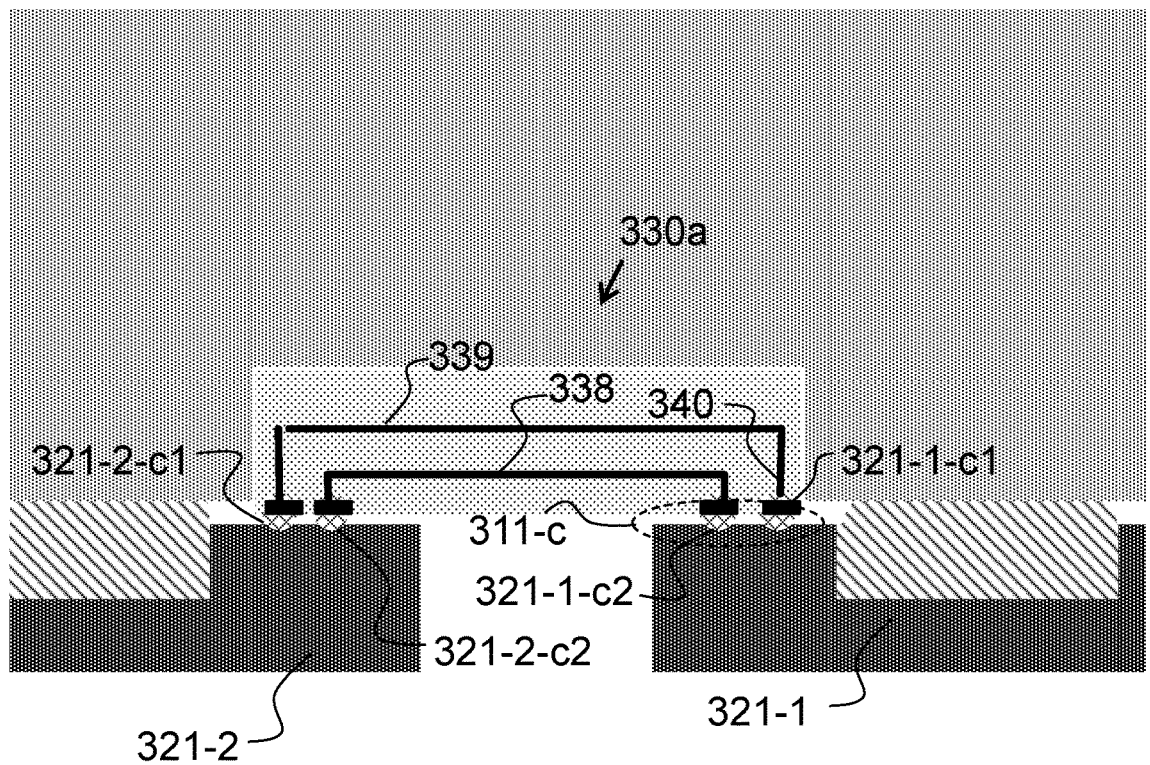
FIG. 3c illustrates a zoom-in of exemplifying embodiments of an electrical component assembly.

In some embodiments, e.g. as illustrated in FIG. 3c, the one or more interconnecting conductors 338, 339 forms multiple inputs and/or outputs, and a respective electrical component 321-1, 321-2, 322, 323 comprises multiple contacts 321-1-c1, 321-1-c2, 321-2-c1, 321-2-c2 wherein a respective contact 321-1-c1, 321-1-c2 of the first electrical component 321-1 is interconnected to a respective contact 321-2-c1, 321-2-c2 of the second electrical component 321-2 323by a respective interconnecting conductor 338, 339 of the electrical interconnect 330a.

In some embodiments herein the electrical contacts 321-1-c1, 321-1-c2, 321-2-c1, 321-2-c2 of the electrical components 321-1, 321-2, 322, 323 that connect to the electrical interconnect 330a has a pitch of less than 800 micrometres. The pitch between the contacts may fulfil requirements for fine pitch PCB assembly. The pitch is the distance between the respective centre of the contacts.

Figure 3D:
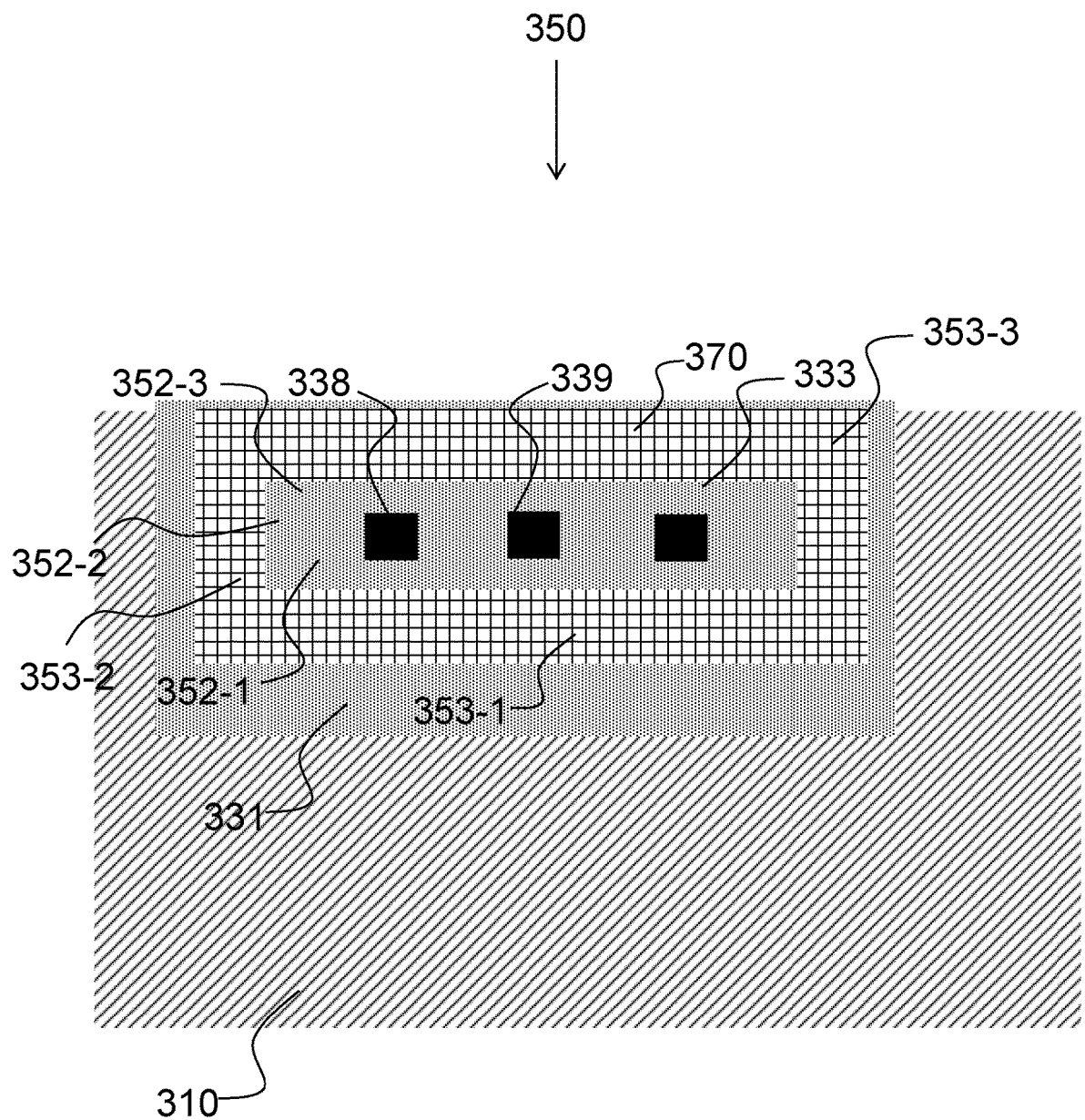
FIG. 3d illustrates further details of exemplifying embodiments of an electrical component assembly.

FIG. 3d illustrates another embodiment of the electrical component assembly 301. In FIG. 3d the electrical interconnect 330a is formed as a shielded-conductor structure 350 which extends along the cavity 311a, 311b, e.g. along a longitudinal length of the cavity 311a, 311b. In some embodiments the shielded-conductor structure 350 is a coaxial structure. The shielded-conductor structure 350 may comprise the at least one dielectric layer 331 of the electrical interconnect 330a arranged between the one or more interconnecting conductors 338, 339 and the heat sink 310 within the cavity 311a, 311b.

FIG. 3d also shows further details of the shielded-conductor structure 350 which may comprise the one or more interconnecting conductors 338, 339 surrounded by one or more dielectric layers 352-1, 352-2, 352-3 of the one or more dielectric layers which in turn is surrounded by one or more layers 353-1, 353-2, 353-3 of deposited material comprising electrically conductive material forming an electrical shield 370 for the one or more interconnecting conductors 338, 339.

Figure 3E:
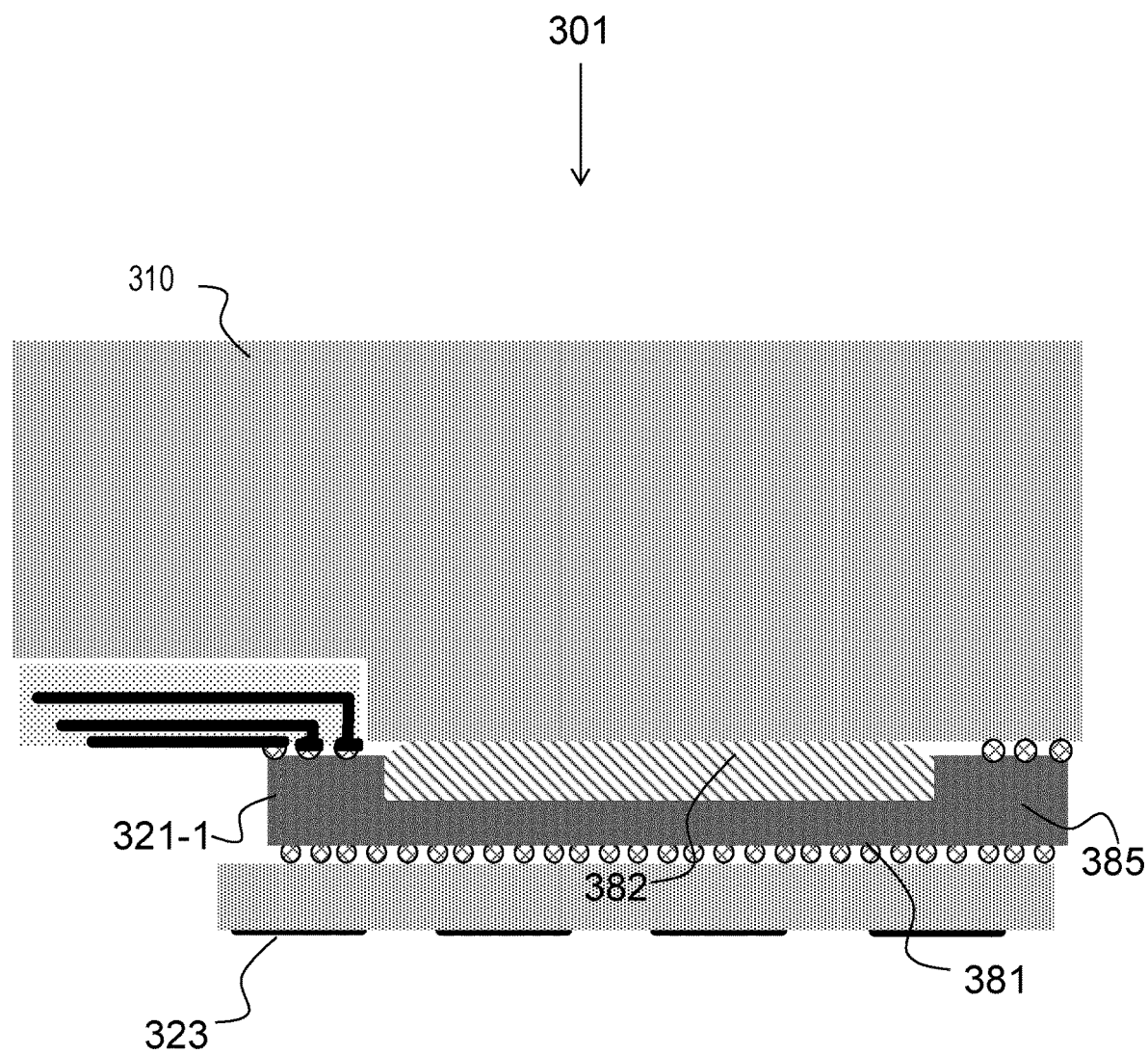
FIG. 3e illustrates further details of exemplifying embodiments of an electrical component assembly.

FIG. 3e illustrates further embodiments of the electrical component assembly 301, wherein the electrical component assembly 301 comprises the third electrical component 323. In FIG. 3e the third electrical component 323 is illustrated as an antenna array. FIG. 3e further illustrates the first electrical component 321-1 as an RFIC in a package 385.

In these further embodiments, the third electrical component 323 may contact the first electrical component 321-1 and/or the second electrical component 321-2, 322 by solder or conductive adhesive on a first surface 381 of the first electrical component 321-1 and/or the second electrical component 321-2, 322 which is opposite a second surface 382 that faces the heat sink 310. The second surface 382 is a surface of the first electrical component 321-1 and/or the second electrical component 321-2, 322. Thus, in FIG. 3e the antenna array 323 contacts the first electrical component 321-1 on the first surface 381 of the first electrical component 321-1, in this case on a surface of the package 385. The second surface 382 of the first electrical component 321-1 faces the heat sink 310. As mentioned above, the first electrical component 321-1 may be mounted directly on the heat sink 310, e.g. by solder.

The first and second surfaces of the first electrical component 321-1 and/or the second electrical component 321-2, 322 may be planar surfaces, or in other words faces or sides. The above way of soldering the third electrical component 323 to the first electrical component 321-1 and/or the second electrical component 321-2, 322 may be used for example for larger antenna arrays or for an additional antenna package which may be soldered on top of RFIC packages.

In another embodiment not shown in the figures, the antenna array 323 may be integrated within the package 385 of the first electrical component 321-1 or within a package of any of the other electrical components, such as any of the RF ICs.

As mentioned above, the heat sink 310 may be electrically conductive. Then at least a first dielectric layer 331 of the electrical interconnect 330a is arranged between the one or more interconnecting conductors 338, 339 and the heat sink 310 within the cavity 311a, 311b to avoid making electrical contact with the electrically conductive heat sink 310.

The cavity 311a, 311b of the heat sink 310 may have different geometries. In some embodiments the cavity 311a, 311b comprises a recess 311a, 311b in the first surface 310a of the heat sink 310. Then the electrical components 321-1, 321-2, 322 may be arranged on the same first surface 310a. This geometry is illustrated in FIG. 3a.

Figure 3F:
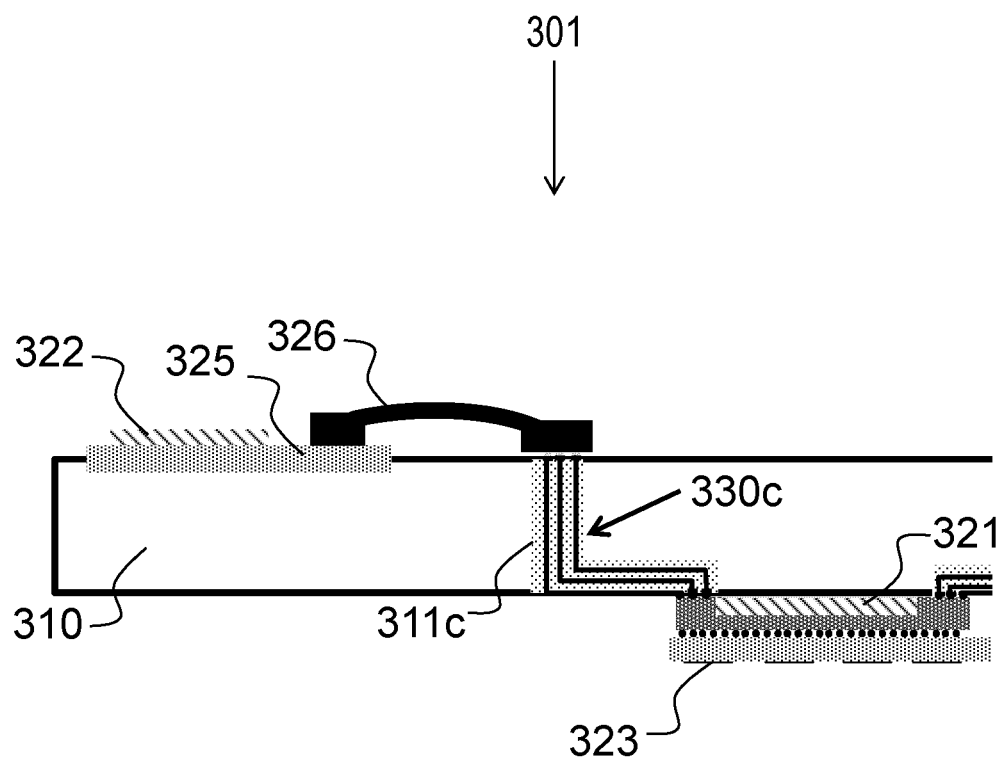
FIG. 3f illustrates further details of exemplifying embodiments of an electrical component assembly.

FIG. 3f shows a cross section of another solution of the heatsink 310 and components assembled onto the heatsink 310. Here, the antenna array 323 is arranged on the first surface 310a of the heat sink 310 and an integrated interconnect 330c goes through the heat sink 310 and connects to the PCB 325 with the cable 326 on the second surface 310b of the heatsink 310. As mentioned above, the second electrical component 322, such as a DBF or a power component, may be mounted on the PCB 325.

Thus, in some embodiments the cavity comprises a hole 311c extending from the first surface 310a of the heat sink 310 to the second surface 310b of the heat sink 310 and the first electrical component 321-1 is arranged on the first surface 310a and the second electrical component 322 is arranged on the second surface 310b.

Figure 3G:
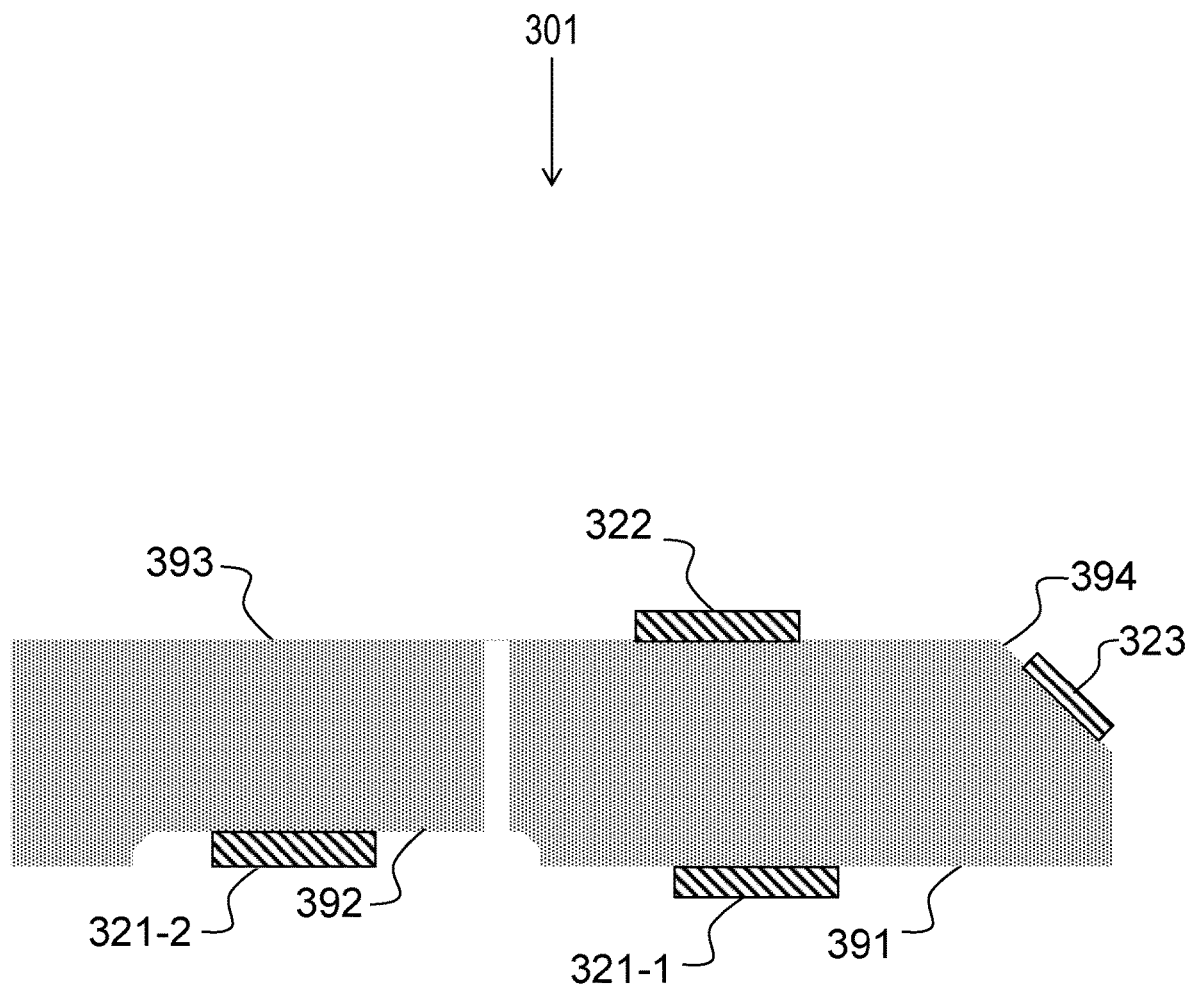
FIG. 3g illustrates further details of exemplifying embodiments of an electrical component assembly.

In general, the electrical components 321-1, 321-2, 322, 323 may be mounted on several surfaces or planes of the heat sink 310 and even on several levels of the heat sink 310. FIG. 3g illustrates an example where the electrical components 321-1, 321-2, 322, 323 are arranged on different surfaces 391, 392, 393, 394 arranged on different levels of the heat sink 310. The surfaces may be created by cavities or by other means. Additive manufacturing is used for creating interconnects.

Electrical connection between the electrical components 321-1, 321-2, 322 and the interconnect 330a, 330b may be achieved in different ways. For example, at least one electrical component 321-1, 321-2, 322, 323 may be connected to the interconnect 330a, 330b by solder or conductive adhesive.

Heat transfer to the heat sink 310 may be achieved by thermally connecting the electrical components 321-1, 321-2, 322 and the heat sink 310. For example, at least one electrical component 321-1, 321-2, 322 may be connected to the heat sink 310 by a Thermal Interface Material, TIM, or by solder.

Specifically, when the at least one electrical component 321-1, 321-2, 322 comprises a die the backside of the die may be connected to the heat sink 310 by the TIM or by solder.

Embodiments for manufacturing the above-described electrical component assembly 301 will now be described with reference to FIG. 4, FIG. 5a, FIG. 5b and FIG. 5c.

Figure 4:
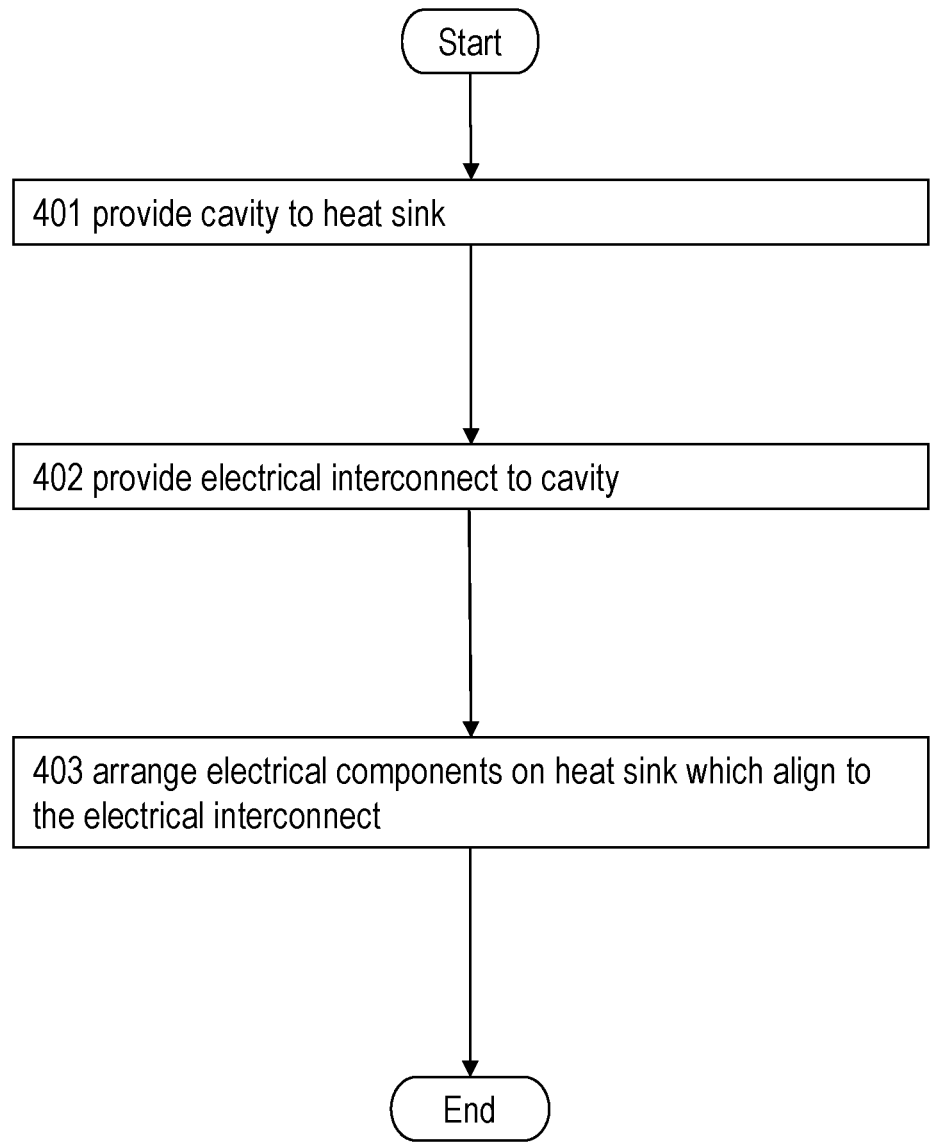
FIG. 4 is a flowchart illustrating embodiments of a method for manufacturing an electrical component assembly.

FIG. 4 is a flow chart describing a method for manufacturing the electrical component assembly 301 according to embodiments herein.

The method may be performed by a computer-aided manufacturing module.

Figure 5A:
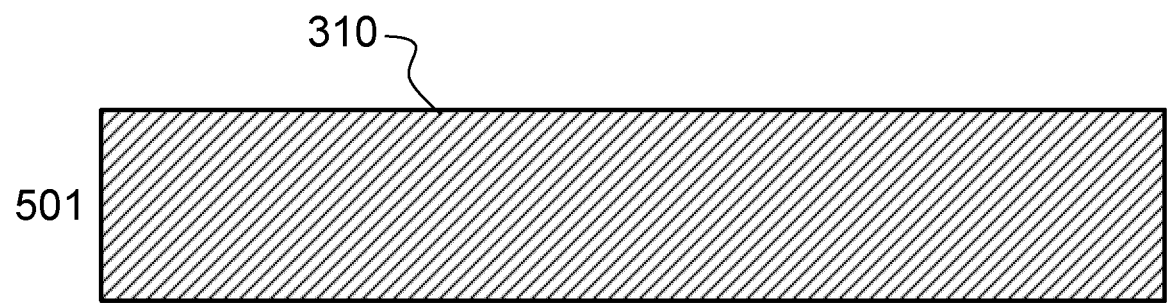
FIG. 5a illustrates exemplifying embodiments of a method for manufacturing an electrical component assembly.
Figure 5A:
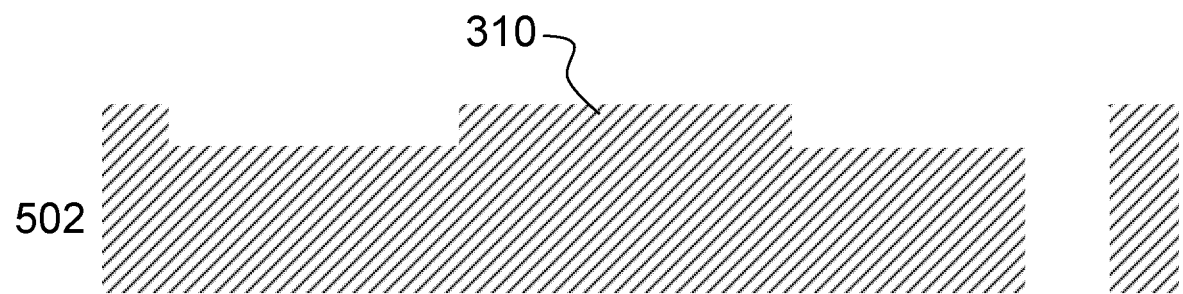
Figure 5A:
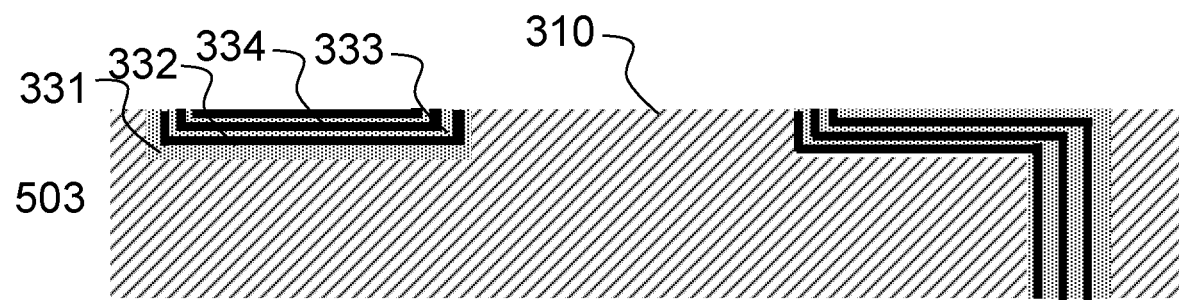

FIG. 5a illustrates different manufacturing phases 501-503 of the heat sink 310 during the manufacturing. A first manufacturing phase 501 illustrates the heat sink 310 (diagonal stripes) before the cavity has been provided.

Action 401

The method comprises providing the cavity 311a, 311b to the heat sink 310. In other words, the heat sink 310 is provided with the cavity 311a, 311b.

The cavity 311a, 311b may for example be provided by: 1) removing material from the heat sink 310, and/or 2) shaping the heat sink 310 by casting in a mould.

A depth of the cavity may match a final height of the dielectric and metal layers, such that the surfaces 310a, 310b of the heat sink 310 are smooth for easy assembly of the electrical components 321-1, 321-2, 322, 323.

A second manufacturing phase 502 in FIG. 5a illustrates the heat sink 310 after the cavity (white) has been provided.

Action 402

By additive manufacturing, the one or more dielectric layers 331, 333 and the at least one layer 332, 334 comprising electrically conductive material of the electrical interconnect 330a are provided to the cavity of the heat sink 310, such that the interconnect 330a is at least partly arranged in and extends along the cavity 311a, 311b of the heat sink 310.

In some embodiments the material layers provided by additive manufacturing are deposited by an ink-jet 3D-printer. Further examples of methods for additive manufacturing may be found in ISO/ASTM 52900.

A third manufacturing phase 503 illustrates the heat sink 310 after the one or more dielectric layers 331, 333 and the at least one layer 332, 334 comprising electrically conductive material of the electrical interconnect 330a have been provided to the cavity of the heat sink 310.

As mentioned above, the heat sink 310 may be made from an electrically conductive material. Then providing the one or more dielectric layers 331, 333 and the at least one layer of electrically conductive material 332, 334 of the electrical interconnect 330a to the cavity 311a, 311b of the heat sink 310 may comprise depositing the first dielectric layer 331 on the heat sink 310 and then depositing further layers of material, such that the first dielectric layer 331 is arranged between the layer 332, 334 comprising electrically conductive material and the heat sink 310 within the cavity 311a, 311b so as to avoid making electrical contact between the electrically conductive material of the interconnect 330a and the electrically conductive heat sink 310.

In some embodiments providing, by additive manufacturing, the one or more dielectric layers 331, 333 and the at least one layer 332, 334 of electrically conductive material of the electrical interconnect 330a to the cavity 311a, 311b of the heat sink, comprises:

depositing one or more first conductive layers 353-1, 353-2 forming a first part of the electrical shield 370 for the one or more interconnecting conductors 338, 339;

depositing first dielectric layers 352-1 which isolate the one or more interconnecting conductors 338, 339;

depositing one or more second conducting layers to provide the one or more interconnecting conductors 338, 339 as shielded conductors;

depositing one or more second dielectric layers 352-2, 352-3 which isolate the one or more interconnecting conductors 338, 339; and depositing one or more third conductive layers 353-3 forming a second part of the electrical shield 370 for the first interconnecting conductor 351.

Once conductive and dielectric layers have been deposited along the length of the cavity 311a, 311b, then the method may continue with depositing conductive and dielectric layers at a component interface of the cavity 311a, 311b, that is at the contact area 311-c. The connection out from the cavity 311a, 311b may be deposited by additive manufacturing of dielectric and conductive material so that the interconnect ends up on the surface 310a, 310b of the heat sink 310. Contact pads, such as the one or more electrical contacts 321-1-c1, 321-2-c1, 321-2-c1, 321-2-c2 of the electrical components 321-323, may also be formed for connection to the respective electrical component 321-1, 321-2, 322. The deposition may be of both dielectric and conductive material at the same time, or layer by layer.

Figure 5B:
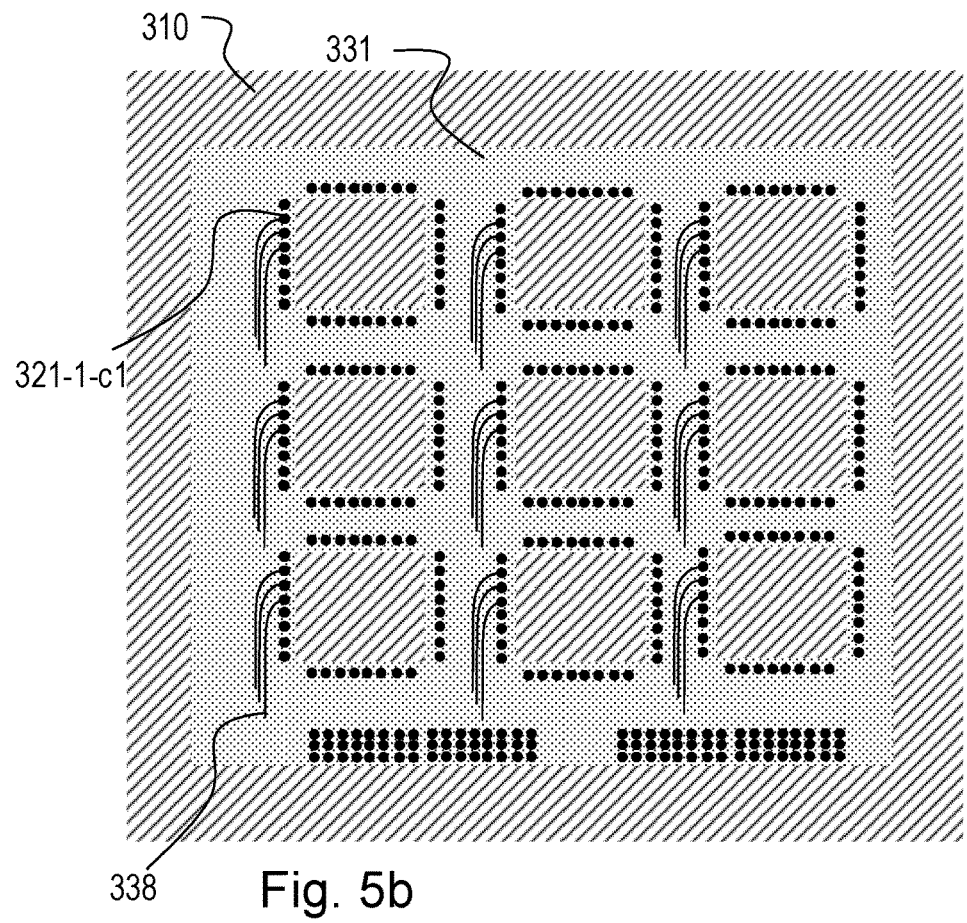
FIG. 5b illustrates further exemplifying embodiments of a method for manufacturing an electrical component assembly.

FIG. 5b illustrates a top view of the heatsink 310 (diagonal stripes) with dielectric material 331 (dotted) and metal connectors 338 (black) arranged in cavities of the heatsink 310. The top view further shows the contact pads 321-1-c1, such as solder pads, going from each assembled electrical component (not shown) to a connector 338.

Action 403

The method further comprises arranging the electrical components 321-1, 321-2, 322, 323 on the heat sink 310 such that the respective electrical contact 321-c1 of the electrical components aligns with the respective interconnecting conductor 351 of the interconnect. Such assembly of the electrical components 321-1, 321-2, 322, 323 onto the heatsink 310 was illustrated in for example FIGS. 3b, 3c and 3e.

Figure 5C:
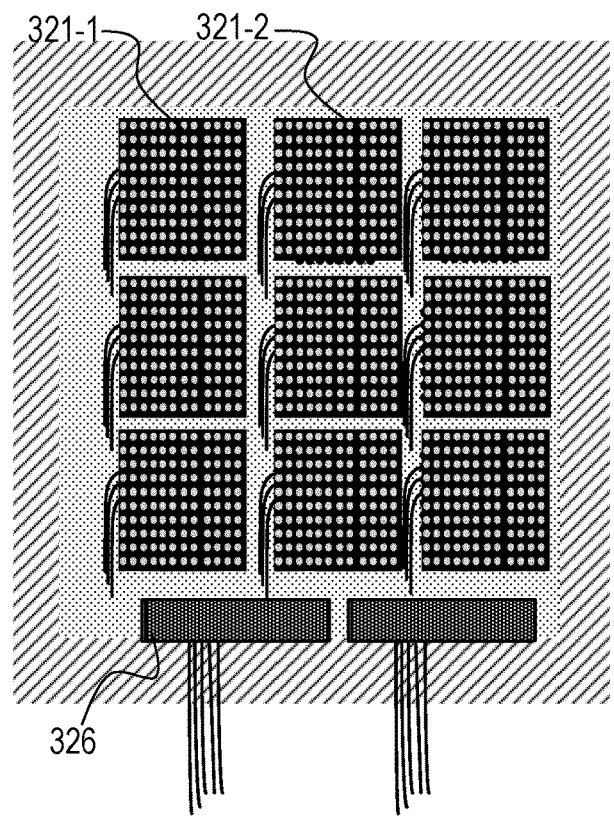
FIG. 5c illustrates further exemplifying embodiments of a method for manufacturing an electrical component assembly.

FIG. 5c illustrate a top view of the electrical component assembly 301 including assembled electrical components (black), such as the first RF circuit 321-1 and the second RF circuit 321-2 but without any antenna PCB. The electrical components 321-1, 321-2, including any connectors, may be assembled with solder balls or similar. The many circular openings in the electrical components illustrate connections to further electrical components such as the antenna PCB. At the bottom of FIG. 5c the two rectangles illustrate connectors going to further electrical components. For example, the two rectangles may illustrate the cable 326 to the DBF circuit 322.

Figure 6:
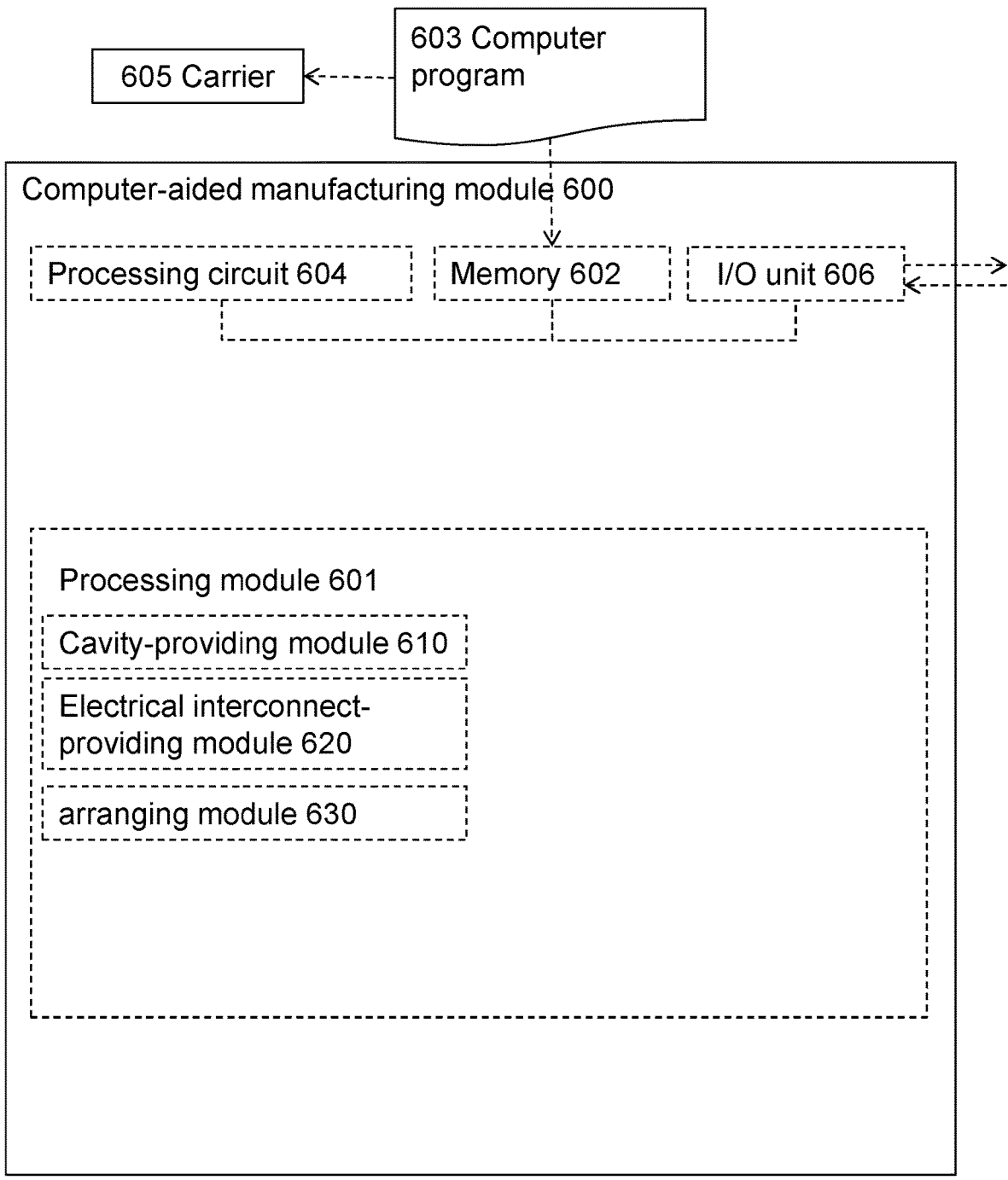
FIG. 6 is a schematic block diagram illustrating embodiments of a computer-aided manufacturing module.

FIG. 6 illustrates a schematic block diagram of embodiments of a computer-aided manufacturing module 600. The computer-aided manufacturing module 600 may also be referred to as a computer-aided manufacturing apparatus 600.

The computer-aided manufacturing module 600 may comprise a processing module 601 for performing the above method actions. The processing module 601 may comprise a cavity-providing module 610 to, e.g., to provide the cavity 311a, 311b to the heatsink 310. The processing module 601 may comprise an electrical interconnect-providing module 620 to, e.g., provide the electrical interconnect 330a, 330b to the cavity 311a, 311b. The processing module 601 may comprise an arranging module 630 to, e.g., arrange, or assemble, the electrical components 321-1, 321-2, 322, 323 to the heat sink 310, e.g. after the cavity 311a, 311b and the electrical interconnect 330a, 330b have been provided.

The embodiments herein may be implemented through a processing circuit 604, 604 e.g. comprising one or more processors, in the electronic ring-shaped device 120 depicted in FIG. 6, together with computer program code, e.g. computer program, for performing the functions and actions of the embodiments herein. The program code mentioned above may also be provided as a computer program product, for instance in the form of a data carrier carrying computer program code for performing the embodiments herein when being loaded into the computer-aided manufacturing module 600. One such carrier may be in the form of a CD ROM disc. It is however feasible with other data carriers such as a memory stick. The computer program code may furthermore be provided as pure program code on a server and downloaded to the computer-aided manufacturing module 600.

The computer-aided manufacturing module 600 may further comprise a memory 602 comprising one or more memory units. The memory 602 comprises instructions executable by the processing circuit in the computer-aided manufacturing module 600. The memory 602 is arranged to be used to store e.g. information, indications, data, configurations, and applications to perform the methods herein when being executed in the computer-aided manufacturing module 600. The memory 602 may be a non-volatile memory e.g., comprising NAND gates, from which the computer-aided manufacturing module 600 may load its program and relevant data. Updates of the software may be transferred via a wireless connection.

To perform the actions 401-403 above, embodiments herein provide a computer program 603, comprising computer readable code units which when executed on the computer-aided manufacturing module 600 causes the computer-aided manufacturing module 600 to perform any of the method actions above.

In some embodiments, the computer program 603 comprises instructions, which when executed by a processor, such as the processing circuit 604 of the computer-aided manufacturing module 600, cause the processor to perform any of the method actions above.

In some embodiments, a carrier 605 comprises the computer program 603 wherein the carrier 605 is one of an electronic signal, an optical signal, an electromagnetic signal, a magnetic signal, an electric signal, a radio signal, a microwave signal and a computer-readable storage medium.

To perform the method actions above, the computer-aided manufacturing module 600 may comprise an Input and Output (I/O) unit 606. The I/O unit 606, 606 may further be part of one or more user interfaces.

Those skilled in the art will appreciate that the modules and/or units in the computer-aided manufacturing module 600 described above may refer to a combination of analog and digital circuits, and/or one or more processors configured with software and/or firmware, e.g., stored in the computer-aided manufacturing module 600, that when executed by, e.g., the processing circuit 601, above causes the computer-aided manufacturing module 600 and/to perform the method actions above. The processing circuit 601, as well as the other digital hardware, may be included in a single Application-Specific Integrated Circuitry (ASIC), or several processors and various digital hardware may be distributed among several separate components, whether individually packaged or assembled into a system-on-a-chip (SoC).

As used herein, the term "module" and the term "unit" may refer to one or more functional modules or units, each of which may be implemented as one or more hardware modules and/or one or more software modules and/or a combined software/hardware module. In some examples, the module may represent a functional unit realized as software and/or hardware.

As used herein, the term "computer program carrier", "program carrier", or "carrier", may refer to one of an electronic signal, an optical signal, a radio signal, and a computer readable medium. In some examples, the computer program carrier may exclude transitory, propagating signals, such as the electronic, optical and/or radio signal. Thus, in these examples, the computer program carrier may be a non-transitory carrier, such as a non-transitory computer readable medium.

As used herein, the term "processing module" may include one or more hardware modules, one or more software modules or a combination thereof. Any such module, be it a hardware, software or a combined hardware-software module, may be a cavity-providing means, electrical interconnect-providing means and arranging means or the like as disclosed herein. As an example, the expression "means" may be a module corresponding to the modules listed above in conjunction with the figures.

As used herein, the term "software module" may refer to a software application, a Dynamic Link Library (DLL), a software component, a software object, an object according to Component Object Model (COM), a software component, a software function, a software engine, an executable binary software file or the like.

The terms "processing module" or "processing circuit" may herein encompass a processing unit, comprising e.g. one or more processors, an Application Specific integrated Circuit (ASIC), a Field-Programmable Gate Array (FPGA) or the like. The processing circuit or the like may comprise one or more processor kernels.

As used herein, the expression "configured to/for" may mean that a processing circuit is configured to, such as adapted to or operative to, by means of software configuration and/or hardware configuration, perform one or more of the actions described herein.

As used herein, the term "action" may refer to an action, a step, an operation, a response, a reaction, an activity or the like. It shall be noted that an action herein may be split into two or more sub-actions as applicable. Moreover, also as applicable, it shall be noted that two or more of the actions described herein may be merged into a single action.

As used herein, the term "memory" may refer to a hard disk, a magnetic storage medium, a portable computer diskette or disc, flash memory, Random Access Memory (RAM) or the like. Furthermore, the term "memory" may refer to an internal register memory of a processor or the like.

As used herein, the term "computer readable medium" may be a Universal Serial Bus (USB) memory, a DVD-disc, a Blu-ray disc, a software module that is received as a stream of data, a Flash memory, a hard drive, a memory card, such as a MemoryStick, a Multimedia Card (MMC), Secure Digital (SD) card, etc. One or more of the aforementioned examples of computer readable medium may be provided as one or more computer program products.

As used herein, the term "computer readable code units" may be text of a computer program, parts of or an entire binary file representing a computer program in a compiled format or anything there between.

As used herein, the terms "number" and/or "value" may be any kind of number, such as binary, real, imaginary or rational number or the like. Moreover, "number" and/or "value" may be one or more characters, such as a letter or a string of letters. "Number" and/or "value" may also be represented by a string of bits, i.e. zeros and/or ones.

As used herein, the expression "in some embodiments" has been used to indicate that the features of the embodiment described may be combined with any other embodiment disclosed herein.

Even though embodiments of the various aspects have been described, many different alterations, modifications and the like thereof will become apparent for those skilled in the art. The described embodiments are therefore not intended to limit the scope of the present disclosure.

The invention claimed is:

1. An electrical components assembly comprising a heat sink, two or more electrical components arranged on the heat sink, and an additively manufactured electrical interconnect electrically connecting the two or more electrical components with each other, wherein the heat sink is integrated with the electrical interconnect such that the electrical interconnect is at least partly arranged in and extends along a cavity of the heat sink extending between the electrical components, wherein the electrical interconnect comprises at least two layers of deposited material comprising electrically conductive material forming at least two interconnecting conductors, and wherein the interconnect further comprises at least two dielectric layers of deposited material which isolate the at least two interconnecting conductors, wherein the at least two interconnecting conductors electrically contact the respective electrical component in a respective contact area of the cavity, and wherein the electrical components are arranged on the heat sink such that respective electrical contacts of the electrical components align with respective interconnecting conductors of the interconnect.

2. The electrical component assembly of claim 1, wherein a first electrical component out of the two or more electrical components is arranged on a first surface of the heat sink and wherein at least a first end of the electrical interconnect electrically contacts the first electrical component at a plane of the first surface.

3. The electrical component assembly of claim 1, wherein the one or more interconnecting conductors forms multiple inputs and/or outputs, and wherein a respective electrical component comprises multiple contacts wherein a respective contact of the first electrical component is interconnected to a respective contact of a second electrical component out of the two or more electrical components by a respective interconnecting conductor of the electrical interconnect.

4. The electrical component assembly of claim 1, comprising a third electrical component which contacts the first electrical component and/or the second electrical component by solder or conductive adhesive on a first surface of the first electrical component and/or the second electrical component which is opposite a second surface that faces the heat sink.

5. The electrical component assembly of claim 1, wherein the heat sink is electrically conductive and wherein at least a first dielectric layer of the electrical interconnect is arranged between the one or more interconnecting conductors and the heat sink within the cavity to avoid making electrical contact with the electrically conductive heat sink.

6. The electrical component assembly of claim 1, wherein the cavity comprises a recess in a first surface of the heat sink and wherein the electrical components are arranged on the same first surface.

7. The electrical component assembly of claim 1, wherein at least one of the two or more electrical components is connected to the interconnect by solder or conductive adhesive and/or at least one electrical component of the two or more electrical components is connected to the heat sink by a Thermal Interface Material (TIM) or solder.

8. The electrical component assembly of claim 1, wherein at least one electrical component of the two or more electrical components is any of: an Integrated Circuit (IC), a Phased Array Antenna Module (PAAM), a Printed Circuit Board (PCB), and a packaged component.

9. The electrical component assembly of claim 8, wherein the IC comprises any one or more of a Radio-Frequency (RF) circuit, a Digital BeamForming (DBF) circuit, an Analog BeamForming (ABF) circuit, and an antenna.

10. An antenna array system comprising the electrical component assembly of claim 1, and further comprising an antenna array, wherein the electrical components of the electrical component assembly comprise at least two RF circuits, wherein the electrical interconnect comprises a first interconnect integrated in a first cavity of the heat sink between the at least two RF circuits.

11. The antenna array system of claim 10, wherein the electrical components of the electrical component assembly further comprise a DBF circuit and wherein the electrical interconnect further comprises a second interconnect integrated in a second cavity of the heat sink between one of the at least two RF circuits and the DBF circuit.

12. An electronic device comprising the electrical component assembly of claim 1.

13. The electronic device of claim 12, wherein the electronic device is any of a base station, an access point, a remote radio unit and a mobile phone.

14. A method for manufacturing an electrical component assembly of claim 1, the method comprising:
providing the heat sink with the cavity;
providing, by additive manufacturing, the at least two dielectric layers and the at least two layers comprising electrically conductive material of the electrical interconnect to the cavity of the heat sink, such that the interconnect is at least partly arranged in and extends along the cavity of the heat sink; and
arranging the electrical components on the heat sink such that the respective electrical contacts of the electrical components align with the respective interconnecting conductors of the interconnect.

15. The method for manufacturing the electrical component assembly of claim 14, wherein the heat sink is made from an electrically conductive material and wherein providing the one or more dielectric layers and the at least one layer of electrically conductive material of the electrical interconnect to the cavity of the heat sink comprises depositing a first dielectric layer on the heat sink and then depositing further layers of material, such that the first dielectric layer is arranged between the layer comprising electrically conductive material and the heat sink within the cavity so as to avoid making electrical contact between the electrically conductive material of the interconnect and the electrically conductive heat sink.

16. The method of claim 14, wherein providing, by additive manufacturing, the one or more dielectric layers and the at least one layer of electrically conductive material of the electrical interconnect to the cavity of the heat sink, comprises:
- depositing one or more first conductive layers forming a first part of the electrical shield for the one or more interconnecting conductors;
- depositing one or more first dielectric layers which isolate the one or more interconnecting conductors;
- depositing one or more second conducting layers to provide the one or more interconnecting conductors as shielded conductors;
- depositing one or more second dielectric layers which isolate the one or more interconnecting conductors; and
- depositing one or more third conductive layers forming a second part of the electrical shield for the first interconnecting conductor.

17. The method of claim 14, wherein the material layers provided by additive manufacturing are deposited by an ink-jet 3D-printer.

* * * * *